(12) United States Patent
Searles et al.

(10) Patent No.: US 12,216,515 B2
(45) Date of Patent: *Feb. 4, 2025

(54) CURRENT MEASUREMENT FOR POWER CONVERTER CIRCUITS

(71) Applicant: Apple Inc., Cupertino, CA (US)

(72) Inventors: Shawn Searles, Austin, TX (US);
Fabio Gozzini, San Jose, CA (US);
Sanjay Pant, Santa Clara, CA (US);
Inder M. Sodhi, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/497,443

(22) Filed: Oct. 30, 2023

(65) Prior Publication Data

US 2024/0126353 A1  Apr. 18, 2024

Related U.S. Application Data

(63) Continuation of application No. 17/211,527, filed on Mar. 24, 2021, now Pat. No. 11,803,219.

(51) Int. Cl.
| | |
|---|---|
| *G06F 1/26* | (2006.01) |
| *G01R 15/14* | (2006.01) |
| *G01R 19/25* | (2006.01) |
| *G05F 1/46* | (2006.01) |
| *G11C 7/10* | (2006.01) |

(52) U.S. Cl.
CPC ............. *G06F 1/26* (2013.01); *G01R 15/146* (2013.01); *G11C 7/1096* (2013.01)

(58) Field of Classification Search
CPC ..... G06F 1/26; G01R 15/146; G01R 19/2506; G11C 7/1096; G11C 5/147; G05F 1/46
USPC .......................................... 323/234
See application file for complete search history.

(56) References Cited

U.S. PATENT DOCUMENTS

| | | | |
|---|---|---|---|
| 5,691,917 A | 11/1997 | Harrison | |
| 6,556,020 B1* | 4/2003 | McCabe | G01R 31/389 |
| | | | 324/426 |
| 7,764,054 B1 | 7/2010 | Guo et al. | |
| 10,101,395 B2 | 10/2018 | Edwards et al. | |
| 10,420,179 B1 | 9/2019 | Chen et al. | |
| 11,803,219 B2* | 10/2023 | Searles | G05F 1/46 |
| 2019/0037515 A1 | 1/2019 | Shamir et al. | |
| 2020/0300989 A1* | 9/2020 | Glover | G01S 7/4813 |
| 2021/0088659 A1* | 3/2021 | Sun | G01S 7/4868 |
| 2022/0239858 A1 | 7/2022 | Dai et al. | |

* cited by examiner

*Primary Examiner* — Michael J Brown
(74) *Attorney, Agent, or Firm* — Kowert, Hood, Munyon, Rankin & Goetzel, P.C.; Dean M. Munyon

(57) ABSTRACT

A power converter circuit included in a computer system may include a phase circuit and a sample circuit. The phase circuit compares a voltage level of the regulated power supply node to a reference voltage to generate a demand current that is used to adjust the voltage level of the regulated power supply node. The phase circuit also digitizes the demand current and stores the resultant bit stream in a memory circuit. The sample circuit generates timestamp information that points to particular storage locations in the memory circuit that correspond to trigger events, allowing the operation of the power converter circuit to be analyzed during different circumstances as well as to adjust operating parameters of the power converter circuit.

20 Claims, 7 Drawing Sheets

CURRENT MEASUREMENT FOR POWER CONVERTER CIRCUITS

PRIORITY CLAIM

The present application is a continuation of U.S. application Ser. No. 17/211,527, entitled "Current Measurement for Power Converter Circuits," filed Mar. 24, 2021, the disclosure of which is incorporated by reference herein in its entirety.

BACKGROUND

Technical Field

This disclosure relates to power management in computer systems, and more particularly to voltage regulator circuit operation.

Description of the Related Art

Modern computer systems may include multiple circuit blocks designed to perform various functions. For example, such circuit blocks may include processors or processor cores configured to execute software or program instructions. Additionally, the circuit blocks may include memory circuits, mixed-signal or analog circuits, and the like.

In some computer systems, the circuit blocks may be designed to operate using different power supply voltage levels. For example, in some computer systems, power management circuits (also referred to as "power management units") may generate and monitor various power supply signals.

Power management circuits often include one or more power converter circuits configured to generate regulator voltage levels on respective power supply signal lines using a voltage level of an input power supply signal. Such converter circuits may employ multiple reactive circuit elements, such as inductors, capacitors, and the like.

SUMMARY OF THE EMBODIMENTS

Various embodiments for a power converter circuit are disclosed. Broadly speaking, a phase circuit included in the power converter circuit is configured to generate a demand current using a comparison of a voltage level of a regulated power supply node and a reference voltage. The phase circuit is further configured to adjust the voltage level of the regulated power supply node using the demand current. Additionally, the phase circuit is configured to digitize the demand current to create a stream of current samples, and store the stream of current samples in a first memory circuit. A sample circuit included in the power converter circuit is configured, in response to a detection of a trigger event, generate timestamp information that includes an address corresponding to a location in the first memory circuit where a particular current sample that corresponds to the trigger event it stored, and store the timestamp information in a second memory circuit. By storing the stream of current samples along with timestamps identifying when particular events occur, real-time behavior of the power converter circuit may be analyzed and changes in the operating parameters of the power converter circuit may be made. The stored data may also be used to improve subsequent designs of the power converter circuit.

DETAILED DESCRIPTION OF EMBODIMENTS

Figure 1:
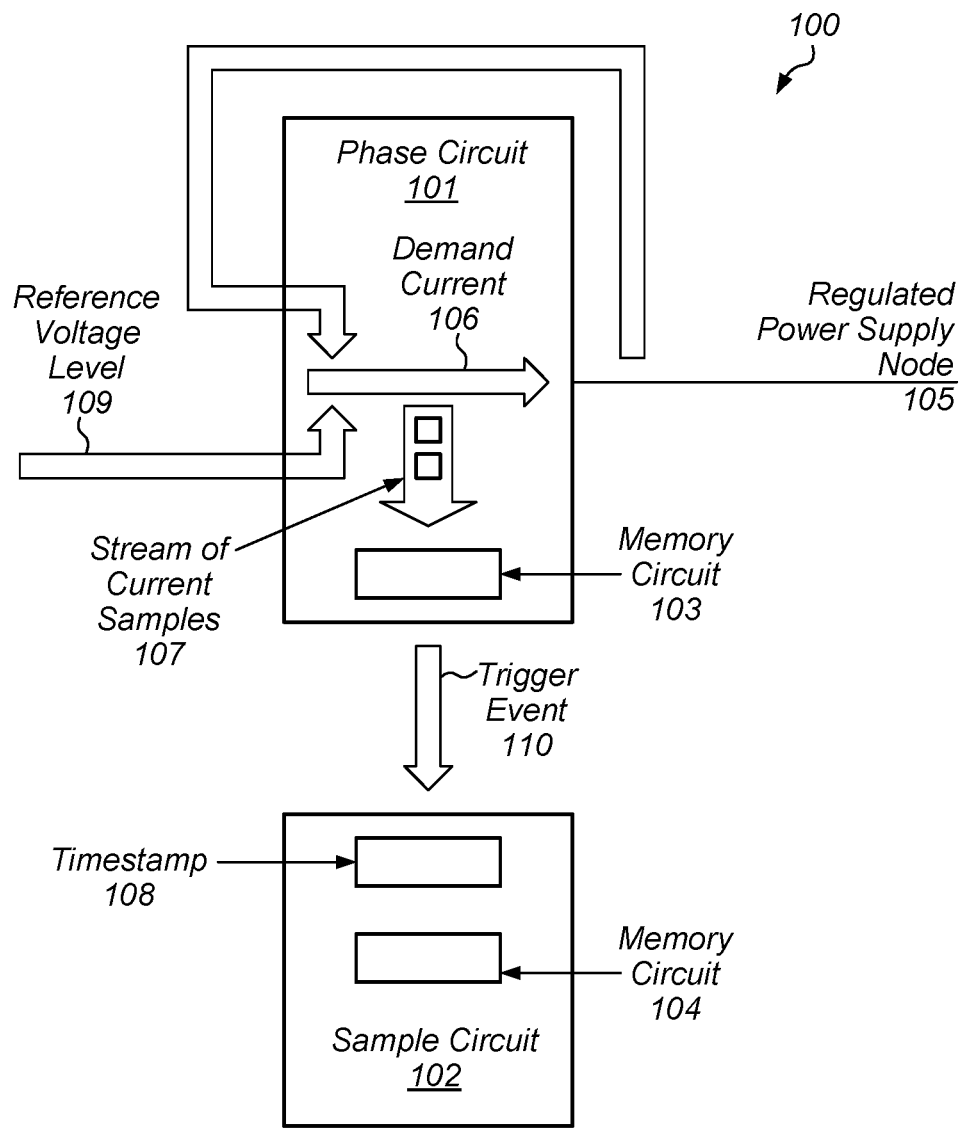
FIG. 1 is a block diagram of an embodiment of a power converter circuit for a computer system.

Computer systems may include multiple circuit blocks configured to perform specific functions. Such circuit blocks may be fabricated on a common substrate and may employ different power supply voltage levels. Power management units (commonly referred to as "PMUs") may include multiple power converter or voltage regulator circuits configured to generate regulated voltage levels for various power supply signals. Such voltage regulator circuits may employ both passive circuit elements (e.g., inductors, capacitors, etc.) as well as active circuit elements (e.g., transistors, diodes, etc.).

Many power converter and voltage regulator circuits employ a control loop, which senses a particular characteristic of a regulated power supply signal and compares a value of the particular characteristic to a threshold value. Based on results of the comparison, charging or discharging of a load circuit by a power converter or voltage regulator circuit may be altered. One characteristic that is often employed is a demand current, that is derived from the difference between a voltage level of a regulated power supply node and a reference voltage level. The demand current represents an altered output current the power converter or voltage regulator will ultimately resolve.

In many computer systems, it is desirable to know how much current a power converter circuit is delivering to a load circuit at any given time. Such knowledge can be used to adjust operation of the power converter circuit (e.g., adding or shedding a phase circuit), overall system operation, or may be used for analysis to improve subsequent power converter and system circuit designs. In some cases, information regarding the load current can be used to allocate power to different load circuits to optimize run-time performance of the overall system. In other cases, the information regarding the load current can be to determine if the power converter circuit is close to exceeding a maximum output rating, so that overall system performance can be adjusted accordingly.

To measure the current delivered by a power converter circuit, small sensor resistors (referred to as "sense resistors") whose values are in the milliohm range, may be placed in series in power supply nodes between the power converter circuit and the load circuit. The voltage drops across such resistors can be used to determine the current being delivered by the power converter circuit. The quality of results using sense resistors is limited due to the bandwidth of measurements that can be made across the resistors. Moreover, the sense resistor solution makes it difficult to determine how changes in power state and the execution of different software or application programs affect the current load on the power converter circuit. Sense resistors can also compromise the performance of the power delivery solution, thereby limiting their use in some applications. Techniques described in the present disclosure allow for measuring the current delivered by a power converter circuit in real time without use of sense resistors, as well as marking the measured current data with time information to match changes in the current to events within a computer system.

A block diagram depicting an embodiment of a power converter circuit is depicted in FIG. 1. As illustrated, power converter circuit 100 includes phase circuit 101 and sample circuit 102. Phase circuit 101 includes memory circuit 103, while sample circuit 102 includes memory circuit 104.

Phase circuit 101 is configured to generate demand current 106 using a comparison of a voltage level of regulated power supply node 105 and reference voltage level 109. In various embodiments, phase circuit 101 is further configured to adjust the voltage level of regulated power supply node 105 using the demand current.

Phase circuit 101 is also configured to digitize demand current 106 to create a stream of current samples 107, and to store stream of current samples 107 in memory circuit 103. In various embodiments, memory circuit 103 may be implemented as a static random-access memory (SRAM) or any other suitable type of memory circuit.

Sample circuit 102 is configured, in response to a detection of trigger event 110, to generate timestamp information 108 that includes a pointer to a location in the first memory circuit where a particular current sample of stream of current samples 107 that corresponds to the trigger event is stored. In various embodiments, sample circuit 102 is further configured to store timestamp information 108 in memory circuit 104. In various embodiments, memory circuit 104 may be implemented as a SRAM or any other suitable type of memory circuit. During data retrieval, timestamp information 108 stored in memory circuit 104 can be used to access particular locations in memory circuit 103.

By storing the stream of current samples 107 along with timestamp information 108, current samples relating to specific events (e.g., a change in power state) may be retrieved from memory circuit 103 using timestamp information 108. The retrieved current samples can be used to determine power consumption, or they may be used to adjust operating parameters (e.g., clock frequency) of phase circuit 101. Since the stream of current samples 107 is gathered in real time, the behavior of demand current 106 can be analyzed prior to certain events, such as a sudden drop in the voltage level of regulated power supply node 105.

In various embodiments, phase circuit 101 may be part of a buck converter where phase circuit 101 is coupled to regulated power supply node via an inductor. In such cases, in order to modify the voltage level of regulated power supply node 105, phase circuit 101 can be enabled by a timing or clock signals. Once enabled, phase circuit 101 is configured to source current to regulated power supply node 105. A duration of how long current is sourced to regulated power supply node 105 is determined based on current sensed through the inductor using a process commonly referred to as pulse width modulation or "PWM."

In other cases, phase circuit 101 may employ pulse frequency modulation or "PFM" to determine the duration of sourcing current to regulated power supply node 105. When PFM is employed, the timing of the PFM event, along with its duration, should be stored in memory circuits 103 and 104. Rather than increasing the size of memory circuit 103 to accommodate additional bits in the stream of current samples 107 that denote PWM versus PFM operation, an encoding scheme is applied to the stream of current samples 107. To encode entry into PFM mode, a particular sequence of current samples in the stream of current samples 107 may be employed. In a similar fashion, another sequence of current sample in the stream of current samples 107 may be used. By using such dedicated sequences, a start and a stop of PFM mode can be identified for subsequent processing.

It is noted that the dedicated sequences may employ a dummy current sample that corresponds to an end of a given dedicated sequence. In some cases, the dummy current sample may be a set of bits of a particular logic value. For example, the dummy current sample may include multiple logical-0 values that correspond to a zero current. The use of such a dummy current sample can present problems when attempting to determine an amount of charge transferred to a load during PFM operation. Unlike when phase circuit 101 is operating in PWM mode, in which integration of the stream of current samples 107 leads to an amount of transferred charge, during PFM operation, such integration will yield a lower value due to the dummy current samples used to encode the start and stop of the PFM event. To remediate this problem, when a PFM is detected, additional charge is added to account for the deficit in the charge determined by integrating the current samples. In various cases, the added amount of charge may be determined empirically based on characteristics of a given power converter circuit. Many other encoding schemes may be employed to uniquely represent the PFM event, some of which may include reducing the charge to account for a surplus of charge defined by the chosen encoding scheme.

Figure 2:
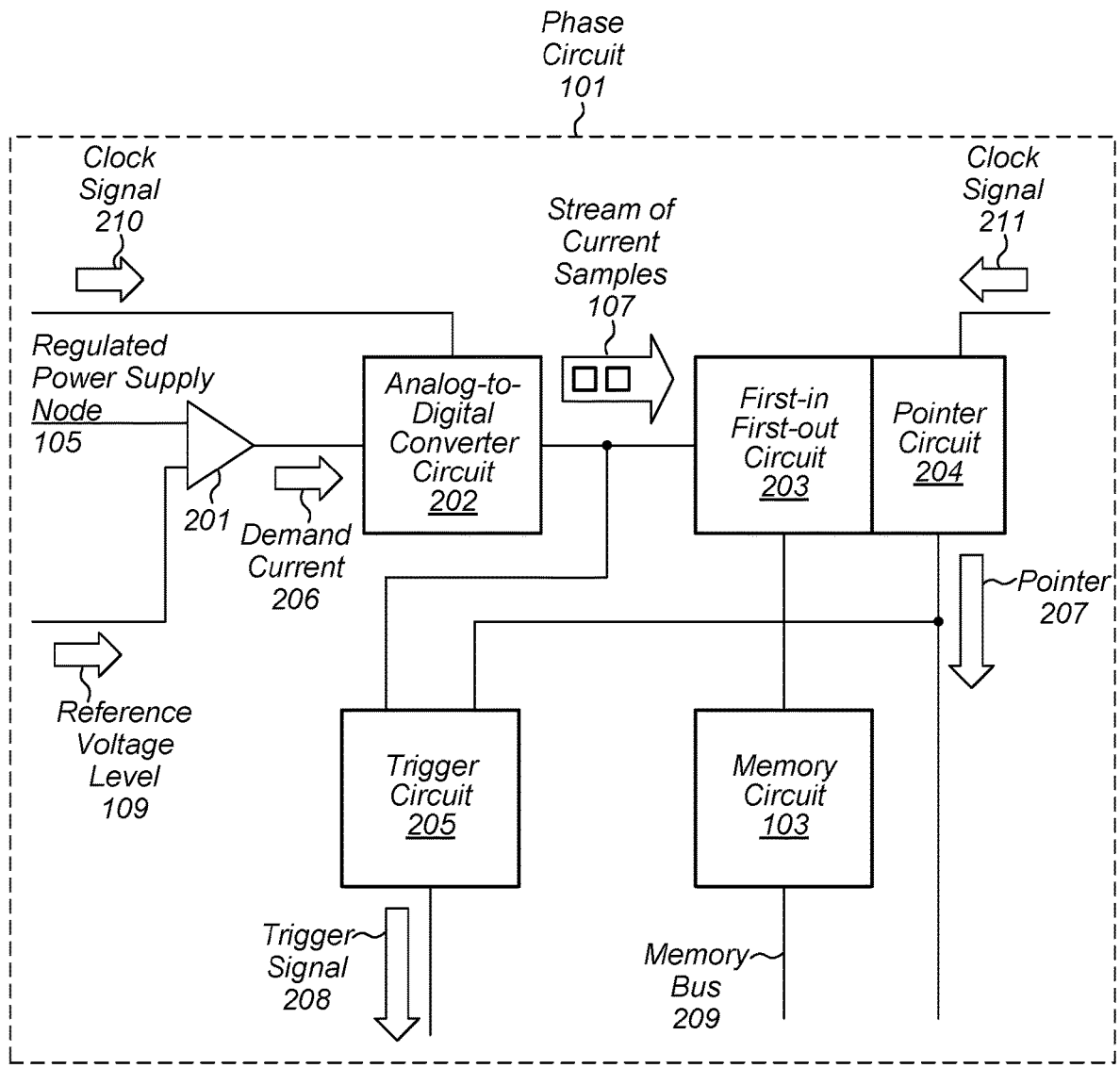
FIG. 2 illustrates a block diagram of a phase circuit included in a power converter circuit.

Turning to FIG. 2, a block diagram of an embodiment of phase circuit 101 is depicted. As illustrated, phase circuit 101 includes comparator circuit 201, analog-to-digital converter circuit 202, first-in first-out circuit 203, pointer circuit 204, trigger circuit 205 and memory circuit 103.

Comparator circuit 201 is configured to generate demand current 206 using the voltage level of regulated power supply node 105 and reference voltage level 109. In various embodiments, comparator circuit 201 is configured to generate demand current 206 such that a magnitude of demand current 206 is related to a difference between the voltage level of regulated power supply node 105 and reference voltage level 109 and may be proportional to the output current that will flow in regulated power supply node 105. In some embodiments, comparator circuit 201 may be implemented as a differential amplifier circuit or other suitable amplifier circuit.

Analog-to-digital converter circuit 202 is configured to generate a stream of current samples 107 using demand current 206 and clock signal 210. In various embodiments, analog-to-digital converter circuit 202 may be implemented as a flash analog-to-digital converter circuit configured to sample demand current during active periods of clock signal 210. It is noted that in some embodiments, comparator circuit 201 and analog-to-digital converter circuit 202 may be implemented as a single circuit block configured to implement the functions described above.

First-in first-out circuit 203 is configured to store different current samples of the stream of current samples 107 into corresponding locations within first-in first-out circuit 203. The location into which a given current sample is stored is controlled by pointer 207, which is generated by pointer circuit 204. In response to a determination that all storage locations are occupied, first-in first-out circuit 203 is configured to transfer the stored current samples to memory circuit 103 as a data word, so that current samples can be stored in memory circuit 103 at a lower frequency than what is generated by analog-to-digital converter circuit 202. In various embodiments, first-in first-out circuit 203 may be implemented using multiple latch circuits, flip-flop circuits, or any other suitable type of storage circuit.

Pointer circuit 204 is configured to generate pointer 207 using clock signal 211. In various embodiments, to generate pointer 207, pointer circuit 204 is configured to modify a value of pointer 207 at the conclusion of an active period of clock signal 211. In some cases, to modify the value of pointer 207, pointer circuit 204 may be further configured to increment the value of pointer 207. A given value of pointer 207 corresponds to a storage location within first-in first-out circuit 203. Once a maximum value for pointer 207 has been reached, pointer circuit 204 is configured to reset to a minimum value. In various embodiments, pointer circuit 204 may be implemented as a counter circuit or other suitable sequential logic circuit. A frequency of clock signals 210 is selected to capture transients on demand current 206 of particular durations. Rather than running the rest of the circuitry at such a frequency, the stream of current samples 107 is converted to data words that can be processed at low frequencies. As such, in various embodiments, a frequency of clock signal 211 is less than a frequency of clock signal 210.

Trigger circuit 205 is configured to generate trigger signal 208 using the stream of current samples 107 and pointer 207. In various embodiments, trigger circuit 205 is configured to generate trigger signal 208 in response to various conditions. For example, the various conditions can include when a particular current sample of the stream of current samples 107 exceeds a threshold value, or when a moving average of the stream of current samples 107 exceeds a different threshold value. Alternatively, trigger circuit 205 is configured to track changes in the stream of current samples 107 and generate trigger signal 208 in response to a rising or falling transition in the stream of current samples exceeding respective threshold values. In some cases, the various threshold values, or other criteria to use may be programable by storing values in control-status registers (CSRs).

In various embodiments, trigger signal 208 may include multiple bits. Some of the bits may encode information indicative that a trigger event has occurred. Other bits may encode a phase relationship between the a given current sample and clock signal 211.

Figure 3:
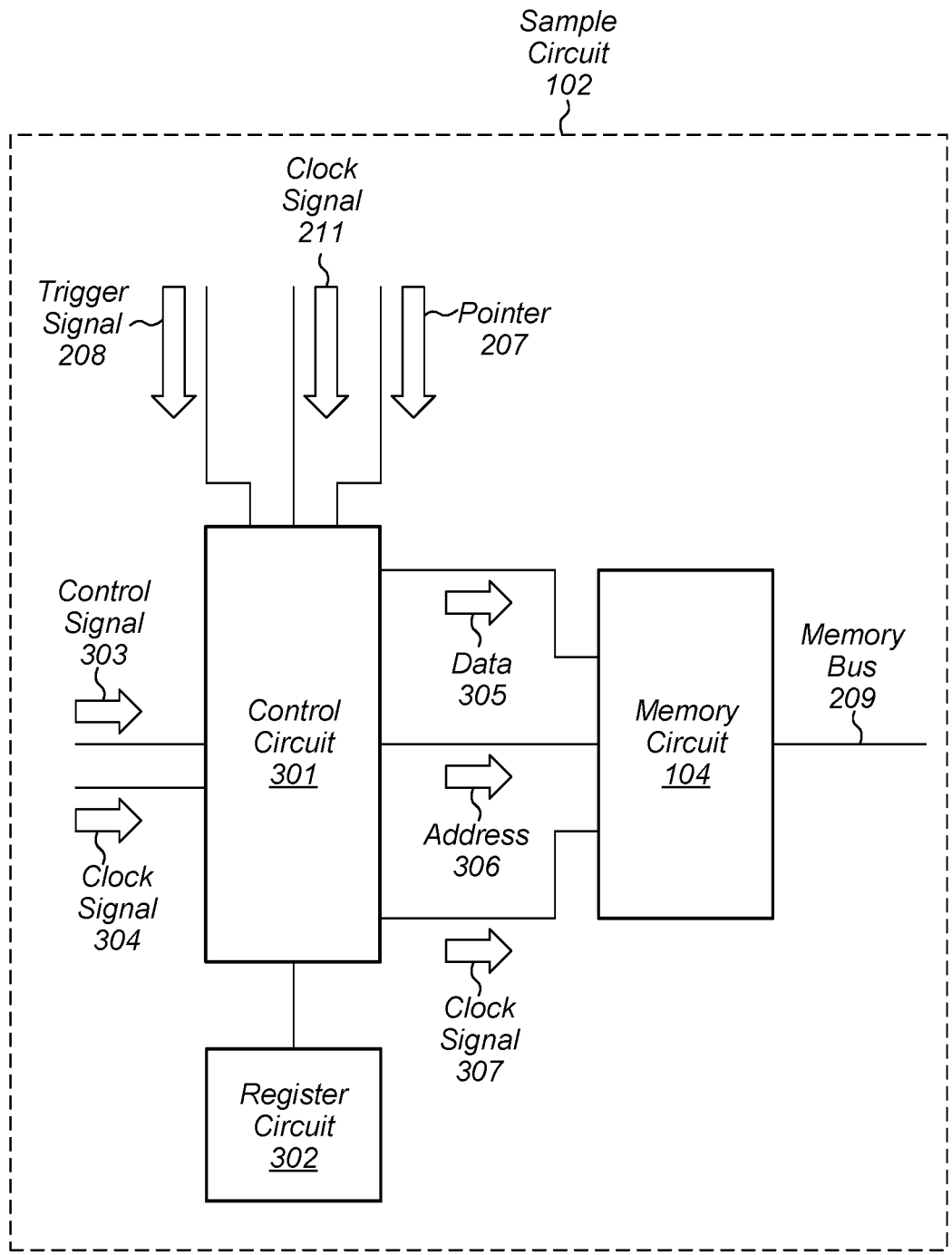
FIG. 3 illustrates a block diagram of an embodiment of a sample circuit for a power converter circuit.

Turning to FIG. 3, a block diagram of an embodiment of sample circuit 102 is depicted. As illustrated, sample circuit 102 includes control circuit 301, register circuit 302, and memory circuit 104.

Control circuit 301 is configured to generate timestamp information 108 using trigger signal 208. In various embodiments, control circuit 301 may additionally use clock signal 211 and pointer 207 to generate timestamp information 108. Pointer 207 includes a phase relationship of the stream of current samples 107 to clock signal 211. Using this information, control circuit 301 can generate an address value of where a current sample that occurred at the time of the trigger is located in memory circuit 103 that can be included in a timestamp. Once a timestamp has been generated, control circuit 301 may generate data 305, address 306, and clock signal 307, which are used to store the timestamp in memory circuit 104.

In addition to using trigger signal 208 to generate timestamp information 108, control circuit 301 may additionally use control signal 303 and contents of register circuit 302 to generate other timestamps for storage into memory circuit 104. In some cases, control circuit 301 may generate and store a timestamp in response to particular values being written into particular ones of register circuits 302. Additionally, control circuit 301 may be configured to generate and store a timestamp in response to an activation of control signal 303.

In various embodiments, control signal 303 may be connected to a general-purpose input-output (GPIO) bus that is connected to board-level hardware of a computer system. Using control signal 303 allows such board-level hardware to initiate triggers in order to capture demand current 106 during various board-level events. Using control signal 303, start timestamps, stop timestamps, or toggle timestamps for recording may be generated. In various embodiments, different functions may be assigned to a rising edge or a falling edge of control signal 303.

In various embodiments, control circuit 301 may be implemented as a microcontroller, state machine, or other suitable sequential logic circuit. It is noted, that control circuit 301 is configured to employ clock signal 304 to operate clocked circuit elements within control circuit 301. In various embodiments, a frequency of clock signal 304 is less than a frequency of clock signal 211.

Register circuit 302 may include one or more storage circuits configured to receive and store trigger information. For example, register circuit 302 may include a first register that may be written with a particular value via a communication bus. When the first register is written to the particular value, a trigger event is initiated and a timestamp generated. Initiating a trigger in this fashion allows time synchronization back to a program counter and a state of an SoC. This can provide insight into how processor load or particular application of software programs affect current demand with power converter circuit 100. It is noted that different values written into the first register circuit may correspond to different triggers and that the different values may be encoded into the corresponding timestamp. In some cases, writing one value into the first register may generate a timestamp that indicates the start of a recording period of the stream of current samples 107, and writing another value may generate a timestamp that indicates the end of the recording period.

Register circuit 302 may also include a second register that is written to various values by a microcontroller included in a power management unit (PMU). The microcontroller can generate more complex triggers similar to what might be employed in a logic analyzer. Different values written into the second register circuit may correspond to different triggers. Such values may be encoded in corresponding timestamp. Like the first register, writing one value into the second register may generate a timestamp that indicates the start of a recording period of the stream of current samples 107, and writing another value may generate a timestamp that indicates the end of the recording period.

Memory circuit 104 is configured to store timestamp information. As such, memory circuit 104 may be referred to as a "timestamp memory." In various embodiments memory circuit 104 is configured to store, using clock signal 307, data 305 at a location corresponding to address 306. In various embodiments, memory circuit 104 is coupled to memory bus 209 and can be accessed by a controller or other circuit coupled to memory bus. For example, a controller may access memory circuit 104 to retrieve information relating to a given timestamp. Using that information, the controller can access memory circuit 103 to retrieve the current information associated with a given timestamp.

In some cases, once a telemetry test has been completed, memory circuit 104 must be cleared to prevent old timestamp data from interfering with new timestamp data. As used herein, a telemetry test refers to the generation of one or more timestamps used to record current samples over a given period of time. In some cases, the period of time may be limited by a storage capacity of memory circuit 104. To clear memory circuit 104, control circuit 301 is configured to sequentially write particular value (e.g., logical-0) to address locations in memory circuit 104.

Figure 4:
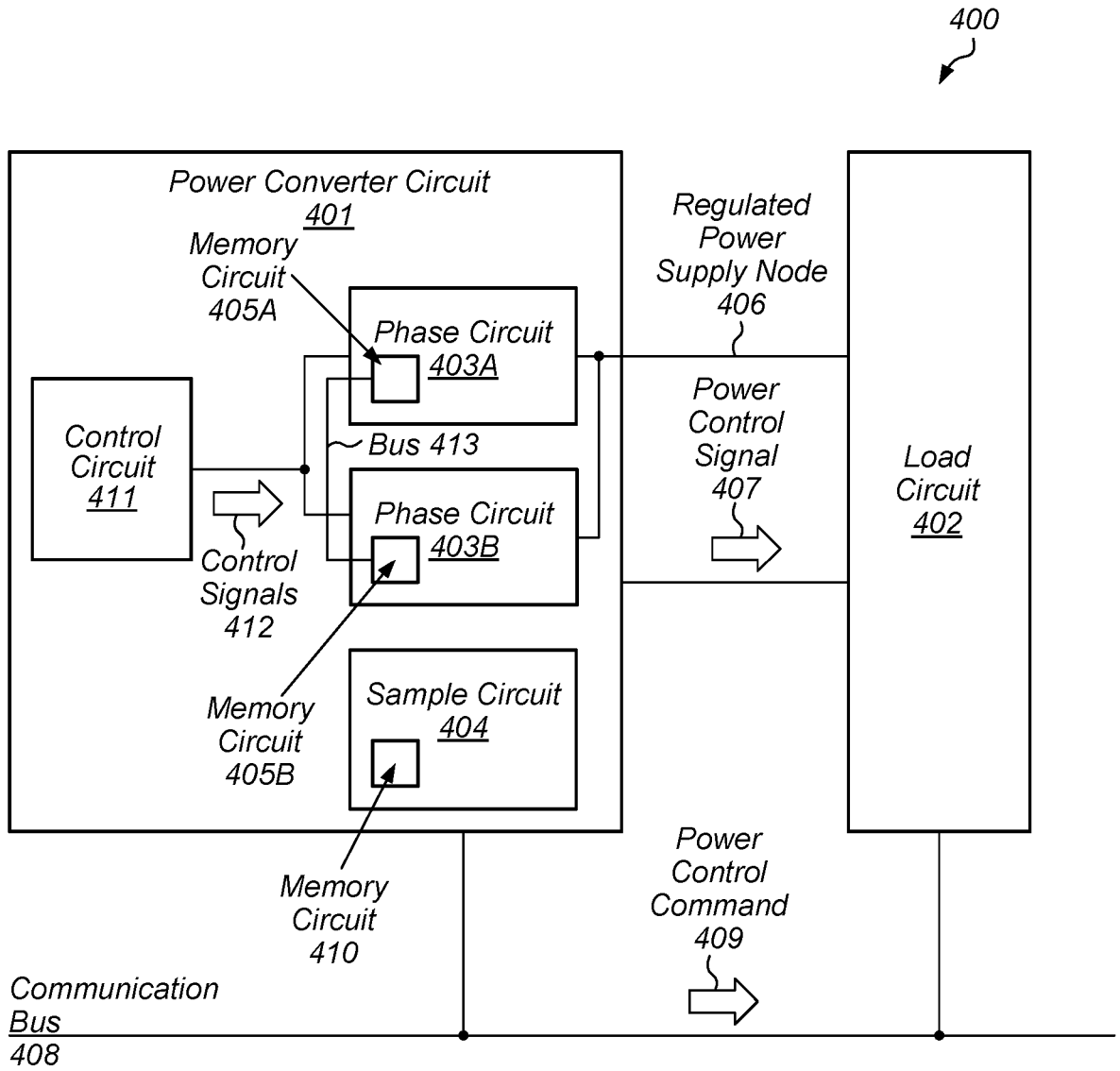
FIG. 4 illustrates a block diagram of an embodiment of a system including a power management unit.

In some computer systems, power converter circuits may be located on separate integrated circuits from their load circuits. A block diagram of an embodiment of such a computer system is depicted in FIG. 4. As illustrated, computer system 400 includes power converter circuit 401 and load circuit 402. In various embodiments, power converter circuit 401 may be located on a different integrated circuit than load circuit 402, which may include processor circuits, memory circuits, analog circuits, etc. In some cases, load circuit 402 may be a system-on-a-chip (SoC).

Power converter circuit 401 includes phase circuits 403A and 403B, sample circuit 404, and control circuit 411. In various embodiments, phase circuits 403A and 403B may correspond to phase circuit 101 as depicted in FIG. 1. As illustrated, phase circuit 403A includes memory circuit 405A, and phase circuit 403B includes memory circuit 405B. In some embodiments, memory circuits 405A and 405B may be telemetry memories and may correspond to memory circuit 103 as depicted in FIG. 1. Power converter circuit 401 is configured to generate a particular voltage level on regulated power supply node 406 for load circuit 402. Although only two phase-circuits are depicted in the embodiment of FIG. 4, in other embodiments, any suitable number of phase circuits may be employed.

Control circuit 411 is configured to generate control signals 412, which may, in various embodiments, control the activation of phase circuits 403A and 403B. In some cases, control circuit 411 may be configured to activate different ones of phase circuits 403A and 403B based on an amount of current demanded by load circuit 402. Control circuit 411 may be implemented, in various embodiments, as a state machine or any other suitable sequential logic circuit.

Memory circuit 405A is coupled to memory circuit 405B via bus 413. In various embodiments, bus 413 may include multiple wires for address, data, and control signals. By coupling the telemetry memory circuits of phase circuits 403A and 403B together as depicted in FIG. 4, the overall storage capacity available to store current samples increases. The increased storage capacity allows for more data to be recorded for a given trigger event. In various embodiments, memory circuit 405A and 405B may occupy different address ranges within an overall telemetry memory address space. Alternatively, memory circuits 405A and 405B may employ separate enable signals that are treated as a most-significant address bit.

Sample circuit 404 includes memory circuit 410. In various embodiments, sample circuit 404 may correspond to sample circuit 102, and memory circuit 410 may correspond to memory circuit 104 as depicted in FIG. 1. In some embodiments, memory circuit 410 is configured to store multiple timestamps relating to different sets of current samples stored in memory circuits 405A and 405B. In some cases, additional information corresponding to different operating modes may be stored in memory circuit 401 or memory circuits 405A and 405B. For example, special symbols may be stored along with the current samples to denote how many phase circuits where operating when the data was gathered. Such special symbols may be particular patterns of bits that would otherwise not occur within the current samples. For example, repeated alternating minimum and maximum values may be used as a special symbol. In some cases, a number of times the minimum/maximum pattern is repeated may correspond to a number of phase circuits that were active was the current samples were gathered.

Power converter circuit 401 is also configured to generate power control signal 407. In various embodiments, power converter circuit 401 is configured to activate power control signal 407 in response to a determination that one or both of corresponding demand currents associated with phase circuits 403A and 403B have exceeded a threshold value. In response to an activation of power control signal 407, load circuit 402 is configured to modify one or more operating parameters (e.g., clock frequency) to reduce power consumption. It is noted that although a single power control signal is depicted in the embodiment of FIG. 4, in other embodiments, power converter circuit 401 may generate multiple power control signals.

Both power converter circuit 401 and load circuit 402 are coupled to communication bus 408, which may be used to transmit messages between different circuit blocks included in a computer system. Although only two circuit blocks are depicted as being coupled to communication bus 408, in other embodiments, any suitable number of circuit blocks may be coupled to communication bus 408.

In addition to, or in lieu of, power control signal 407, power converter circuit 401 is configured to generate power control command 409, in response to a determination that one or both of corresponding demand currents associated with phase circuits 403A and 403B have exceeded a threshold value. Power converter circuit 401 is further configured to transmit power control command 409 to load circuit 402 via communication bus 408. In response to receiving power control command 409 via communication bus 408, load circuit 402 is configured to modify one or more operating parameters to reduce power consumption. It is noted that given communication traffic on communication bus 408, there may be a latency between the time that power converter circuit 401 generates power control command 409 and the time that load circuit 402 responds.

Figure 5:
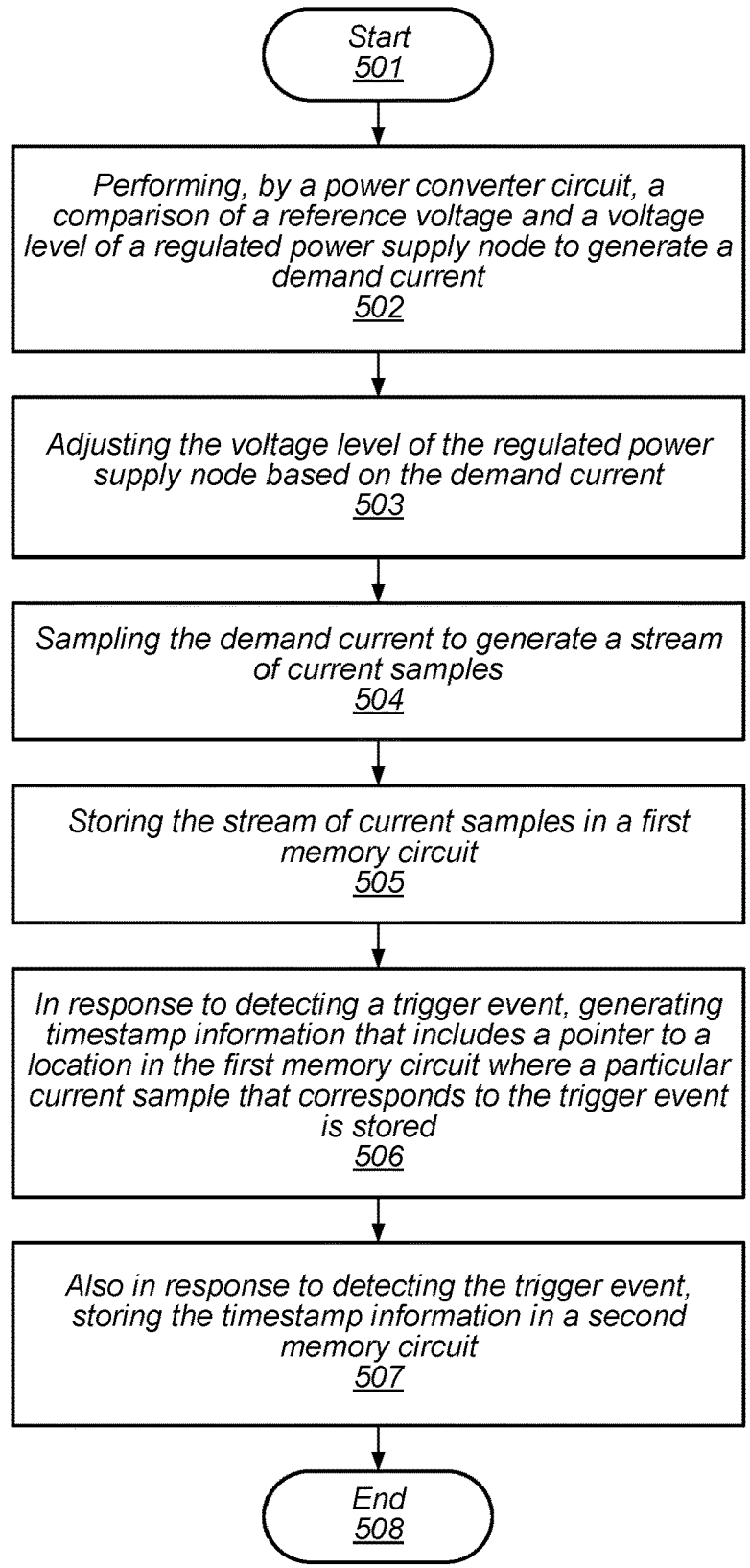
FIG. 5 illustrates a flow diagram depicting an embodiment of another method for operating a power converter circuit.

Turning to FIG. 5, a flow diagram depicting an embodiment of a method for operating a power converter circuit is illustrated. The method, which may be applied to power converter circuit 100, begins in block 501.

The method includes performing, by a power converter circuit, a comparison of a reference voltage and a voltage level of a regulated power supply node to generate a demand current (block 502). In various embodiments, the power converter circuit may include a plurality of phase circuits. The method may further include adjusting operating parameters of one or more of the plurality of phase circuits using data retrieved from the first memory circuit and the second memory circuit.

The method also includes adjusting the voltage level of the regulated power supply node based on the demand current (block 503). In various embodiments, adjusting the voltage level of the regulated power supply node includes sourcing a current to the regulated power supply node via an inductor coupled between the power converter circuit and the regulated power supply node.

The method further includes sampling the demand current to generate a stream of current samples (block 504). In some embodiments, a given current sample of the stream of current samples includes a plurality of bits, whose values encode a magnitude of the demand current at a corresponding time point.

The method also includes storing the stream of current samples in a first memory circuit (block 505). In various embodiments, storing the stream of current samples includes combining a given number of current samples to form a data word and storing the data word in the first memory circuit. In other embodiments, combining the given number of samples to form the data word includes storing a subset of the stream of current samples into corresponding locations in a first-in first-out circuit. In some embodiments, storing the data word includes storing the data word into the first memory circuit in response to determining the first-in first-out circuit is full, and incrementing a pointer in response to storing the data word in the first memory circuit.

The method further includes, in response to detecting a trigger event, generating timestamp information that includes a pointer to a location in the first memory where a particular current sample that correspond to the trigger event is stored (block 506). In various embodiments, the method includes generating the timestamp information using a value of the pointer when the trigger event occurs.

The method also includes, in response to detecting the trigger event, storing the timestamp information in a second memory circuit (block 507). In various embodiments, the method further includes detecting the trigger event evening in response to determining that a moving average of the stream of current samples exceeds a threshold value. In other embodiments, the method also includes, in response to completing a telemetry test, clearing the second memory circuit, wherein clearing the second memory circuit includes sequentially storing logical-0 values at each address location in the second memory circuit. The method concludes in block 508.

Figure 6:
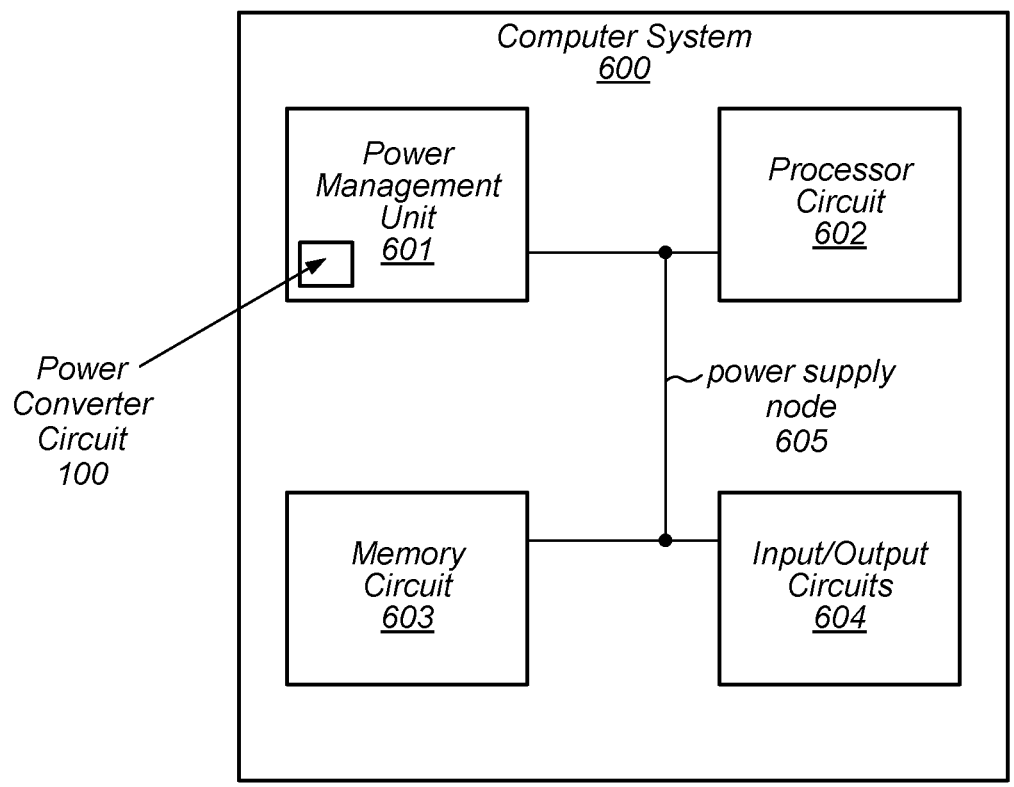
FIG. 6 is a block diagram of an embodiment of a computer system.

A block diagram of a computer system is illustrated in FIG. 6. In the illustrated embodiment, computer system 600 includes power management unit 601, processor circuit 602, memory circuit 603, and input/output circuits 604, each of which is coupled to power supply node 605. In various embodiments, computer system 600 may be a system-on-a-chip (SoC) and/or be configured for use in a desktop computer, server, or in a mobile computing application such as, e.g., a tablet, laptop computer, or wearable computing device.

Power management unit 601 includes power converter circuit 100 which is configured to generate a regulated voltage level on power supply node 606 in order to provide power to processor circuit 602, input/output circuits 604, and memory circuit 603. Although power management unit 601 is depicted as including a single power converter circuit, in other embodiments, any suitable number of power converter circuits may be included in power management unit 601, each configured to generate a regulated voltage level on a respective one of multiple power supply nodes included in computer system 600.

Processor circuit 602 may, in various embodiments, be representative of a general-purpose processor that performs computational operations. For example, processor circuit 602 may be a central processing unit (CPU) such as a microprocessor, a microcontroller, an application-specific integrated circuit (ASIC), or a field-programmable gate array (FPGA).

Memory circuit 603 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 6, in other embodiments, any suitable number of memory circuits may be employed.

Input/output circuits 604 may be configured to coordinate data transfer between computer system 600 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 604 may be configured to implement a version of Universal Serial Bus (USB) protocol or IEEE 1394 (Firewire®) protocol.

Input/output circuits 604 may also be configured to coordinate data transfer between computer system 600 and one or more devices (e.g., other computing systems or integrated circuits) coupled to computer system 600 via a network. In one embodiment, input/output circuits 604 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 604 may be configured to implement multiple discrete network interface ports.

Figure 7:
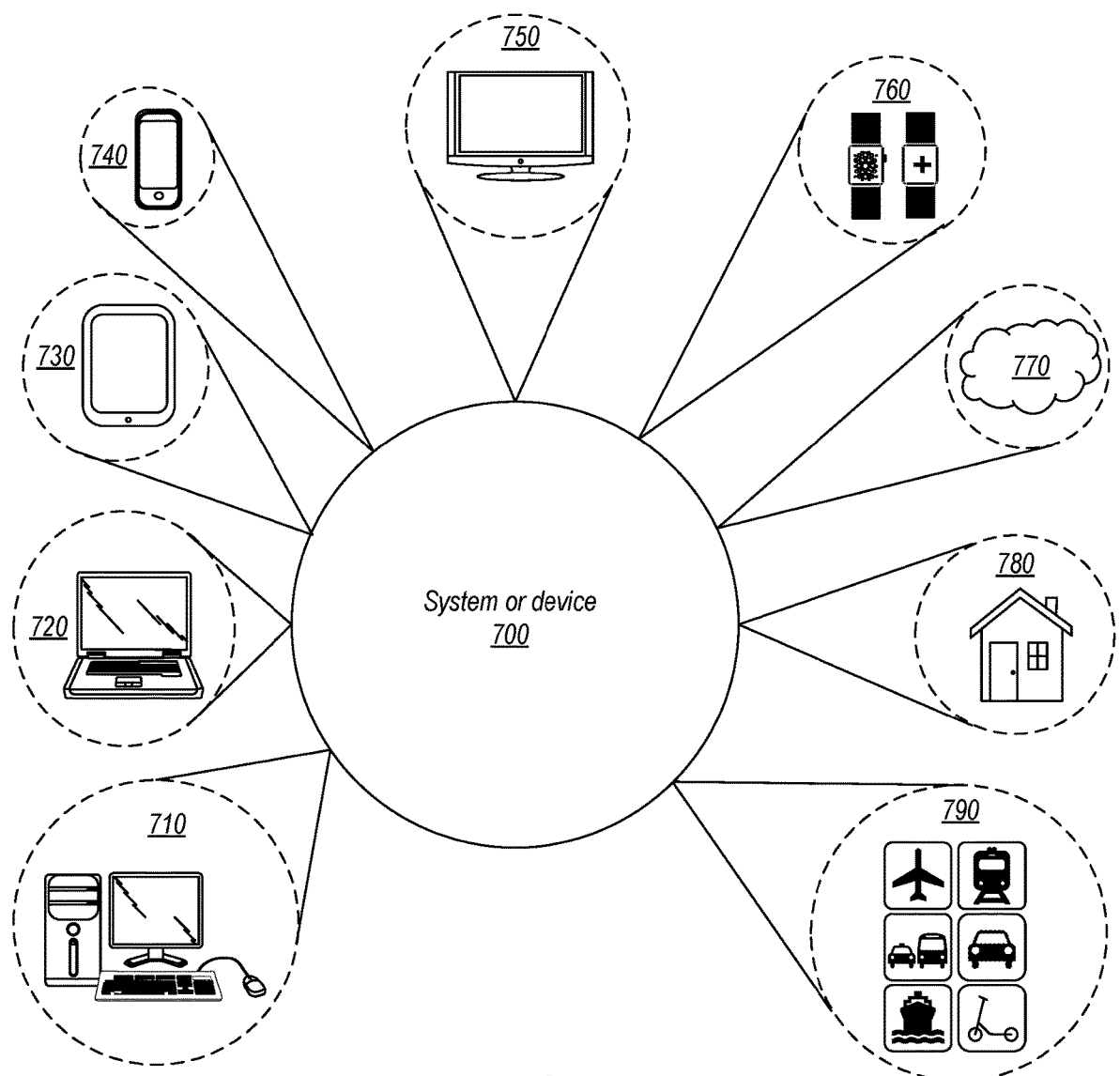
FIG. 7 is a block diagram of an embodiment of a system.

Turning now to FIG. 7, various types of systems that may include any of the circuits, devices, or systems discussed above are illustrated. System or device 700, which may incorporate or otherwise utilize one or more of the techniques described herein, may be utilized in a wide range of areas. For example, system or device 700 may be utilized as part of the hardware of systems such as a desktop computer 710, laptop computer 720, tablet computer 730, cellular or mobile phone 740, or television 750 (or set-top box coupled to a television).

Similarly, disclosed elements may be utilized in a wearable device 760, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 700 may also be used in various other contexts. For example, system or device 700 may be utilized in the context of a server computer system, such as a dedicated server or on shared hardware that implements a cloud-based service 770. Still further, system or device 700 may be implemented in a wide range of specialized everyday devices, including devices 780 commonly found in the home such as refrigerators, thermostats, security cameras, etc. The interconnection of such devices is often referred to as the "Internet of Things" (IoT). Elements may also be implemented in various modes of transportation. For example, system or device 700 could be employed in the control systems, guidance systems, entertainment systems, etc. of various types of vehicles 790.

The applications illustrated in FIG. 7 are merely exemplary and are not intended to limit the potential future applications of disclosed systems or devices. Other example applications include, without limitation: portable gaming devices, music players, data storage devices, unmanned aerial vehicles, etc.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y.

On the other hand, a phrase such as "either x or y, but not both" makes clear that "or" is being used in the exclusive sense.

A recitation of "w, x, y, or z, or any combination thereof" or "at least one of w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus comprising:
a power converter configured to generate a regulated supply voltage, wherein the power converter includes a first phase circuit configured to generate a first demand current, wherein the first phase circuit includes:
  a current sampling circuit configured to generate a stream of digital samples of the first demand current;
  a first memory circuit configured to store a plurality of data words, wherein a given one of the plurality of data words comprises a plurality of digital samples; and
  a trigger circuit configured to generate a trigger signal in response to detecting a trigger event in the stream of digital samples; and
a sample circuit coupled to the first phase circuit, wherein the sample circuit includes:
  a control circuit configured to generate a timestamp value in response to generation of the trigger signal and further configured to generate an address indicative of a location in the first memory circuit storing a particular one of the plurality of digital samples corresponding to the trigger event.

2. The apparatus of claim 1, wherein the current sampling circuit includes:
a comparator configured to generate a demand current signal based on comparing a reference voltage to the regulated supply voltage; and
an analog-to-digital converter circuit configured to, in accordance with a clock signal, generate the stream of digital samples based on the demand current signal.

3. The apparatus of claim 2, wherein the first phase circuit further includes:
a first-in first-out (FIFO) memory configured to receive and store digital samples of the stream of digital samples to form the plurality of digital samples, and, in response to determining all storage locations of the FIFO are full, transfer the plurality of digital samples to the first memory circuit as a given one of the plurality of data words; and
a pointer circuit configured to generate a pointer to a location in the FIFO memory in which a next one of the plurality of digital samples is to be stored.

4. The apparatus of claim 2, wherein the sample circuit further includes a second memory circuit configured to store timestamp values corresponding to trigger events indicated by assertions of the trigger signal.

5. The apparatus of claim 2, wherein the sample circuit further includes a register circuit configured to store trigger information received from a communication bus, wherein the trigger information is usable to initiate the trigger event.

6. The apparatus of claim 1, wherein the power converter includes a plurality of phase circuits including the first phase circuit, and wherein the power converter further includes a second control circuit configured to activate selected ones of the plurality of phase circuits based on the first demand current.

7. The apparatus of claim 6, further comprising a communication bus coupled to the power converter, wherein the power converter is configured to generate a power control command in response to a determination that the first demand current exceeds a threshold for one or more of the plurality of phase circuits, and further configured to transmit the power control command onto the communication bus.

8. The apparatus of claim 7, further comprising a load circuit coupled to receive the regulated supply voltage from the power converter, and further configured to receiver the power control command via the communication bus, wherein the load circuit is further configured to modify one or more operating parameters in response to receiving the power control command.

9. The apparatus of claim 8, wherein the one or more operating parameters include a frequency of a clock signal at which the load circuit operates.

10. A method comprising:
generating, using a power converter, a regulated supply voltage;
generating, using a first phase circuit of the power converter, a first demand current;
generating, using a current sampling circuit of the first phase circuit, a stream of digital samples of the first demand current;
storing, in a first memory circuit, a plurality of data words, wherein a given one of the plurality of data words comprises a plurality of digital samples;
generating a trigger signal, using a trigger circuit, in response to detecting a trigger event in the stream of digital samples;
generating, using a sample circuit and in response to the generation of the trigger signal, a timestamp value; and
generating, using the sample circuit, an address indicative of a location in the first memory circuit storing a particular one of the plurality of digital samples corresponding to the trigger event.

11. The method of claim 10, further comprising:
generating, using a comparator of the sampling circuit, a demand current signal based on a comparison of the regulated supply voltage to a reference voltage; and
generating, using the demand current signal and an analog-to-digital converter, the stream of digital samples.

12. The method of claim 11, further comprising:
storing in a first-in first-out (FIFO) memory, digital samples of the stream of digital samples to form the plurality of digital samples,
transferring the plurality of digital samples to the first memory circuit as a given one of the plurality of data words in response to determining all storage locations of the FIFO are full, transfer; and
generating, using a pointer circuit, a pointer to a location in the FIFO memory in which a next one of the plurality of digital samples is to be stored.

13. The method of claim 11, further comprising storing, in a second memory circuit, timestamp values corresponding to trigger events indicated by assertions of the trigger signal.

14. The method of claim 11, further comprising storing, in a register circuit, trigger information received from a communication bus, wherein the trigger information is usable to initiate the trigger event.

15. The method of claim 10, further comprising conveying, from the power converter to a load circuit coupled to receive the regulated supply voltage, a power command.

16. The method of claim 15, further comprising conveying the power command via a communication bus.

17. The method of claim 16, further comprising the load circuit adjusting one or more operating parameters in response to receiving the power command.

18. A system comprising:
a load circuit;
a power converter configured to provide a regulated supply voltage to the load circuit, wherein the power converter includes a plurality of phase circuits, wherein ones of the plurality of phase circuits are configured to generate a demand current, and wherein a given one of the plurality of phase circuits includes:
  a current sampling circuit configured to generate a stream of digital samples of the demand current;
  a first memory circuit configured to store a plurality of data words, wherein a given one of the plurality of data words comprises a plurality of digital samples; and
  a trigger circuit configured to generate a trigger signal in response to detecting a trigger event in the stream of digital samples; and
a sample circuit coupled to the plurality of phase circuits, wherein the sample circuit includes:
  a first control circuit configured to generate a time-stamp value in response to generation of the trigger signal by at least one of the plurality of phase circuits, and further configured to generate and address indicative of a location in the first memory circuit storing a particular one of the plurality of digital samples corresponding to the trigger event.

19. The system of claim 18, wherein, in response to the trigger event, the power converter is configured to convey a power command to the load circuit, and wherein the load circuit is configured to, in response to receiving the power command, adjust one or more operating parameters.

20. The system of claim 18, wherein the power converter includes a second control circuit configured to activate and deactivate ones of the plurality of phase circuits based on the demand current.

\* \* \* \* \*